United States Patent [19]

Shimizu et al.

[11] Patent Number: 5,508,632
[45] Date of Patent: Apr. 16, 1996

[54] METHOD OF SIMULATING HOT CARRIER DETERIORATION OF AN MOS TRANSISTOR

[75] Inventors: Satoshi Shimizu; Motoaki Tanizawa, both of Hyogo, Japan

[73] Assignee: Mitsubishi Denki Kabushiki Kaisha, Tokyo, Japan

[21] Appl. No.: 262,112

[22] Filed: Jun. 17, 1994

[30] Foreign Application Priority Data

Sep. 28, 1993 [JP] Japan ................... 5-241161

[51] Int. Cl.$^6$ .......................... G01R 31/26
[52] U.S. Cl. .................. 324/769; 324/768; 324/765
[58] Field of Search ................. 324/769, 768, 324/765, 766, 767, 769

[56] References Cited

U.S. PATENT DOCUMENTS 4,942,357  7/1990  Chang .................... 324/769

OTHER PUBLICATIONS

"Simulation of MOSFET Lifetime Under AC Hot–Electron Stress", by Mary M. Kuo et al, *IEEE Trans. Electron Devices*, vol. 35, pp. 1004–1011, Jul. 1988.
"A Simple Method to Characterize Substrate Current in MOSFET's", by T. Y. Chan et al, *IEEE Electron Device Lett.*, vol. EDL–5, pp. 505–507, Dec. 1984.
"BSIM: Berkeley Short–Channel IGFET Model for MOS Transistors", by Bing J. Sheu et al, *IEEE J. Solid–State Circuits*, vol. SC–22, pp. 558–566, Aug. 1987.
"Hot–Carrier Current Modeling and Device Degradation in Surface–Channel p–MOSFET's", by Tong–Chern Ong et al, *IEEE Trans. Electron Devices*, vol. 37, pp. 1658–1666, Jul. 1990.
"Lucky–Electron Model of Channel Hot–Electron Injection in MOSFET's", by Simon Tam et al, *IEEE Trans. Electron Devices*, vol. ED–31, pp. 1116–1125, Sep. 1984.

*Primary Examiner*—Kenneth A. Wieder
*Assistant Examiner*—Kourosh Cyrus Khosravi
*Attorney, Agent, or Firm*—Lowe, Price, LeBlanc & Becker

[57] ABSTRACT

In a method of simulating hot carrier deterioration of an MOS transistor, $$\Delta I_D/I_D = (\Delta I_D/I_D)_f \cdot (W \cdot B)^{-n} \cdot I_{SUB}{}^{mn} \cdot I_D{}^{(1-m)n} \cdot t^n$$

$$\Delta I_D/I_D = (\Delta I_D/I_D)_f \cdot B^{-n} \cdot W^{-mn} \cdot I_G{}^{mn} \cdot t^n$$

is used in the simulation for a P-MOS transistor, where B is a constant, W is a gate width, $I_{SUB}$ is a substrate current, $I_D$ is a drain current, t is a time, $I_G$ is a gate current, n is represented by a function $g=(V_G, V_D)$, and $V_G$ and $V_D$ represent a gate voltage and a drain voltage, respectively.

14 Claims, 14 Drawing Sheets

METHOD OF SIMULATING HOT CARRIER DETERIORATION OF AN MOS TRANSISTOR

BACKGROUND OF THE INVENTION

1. Field of the Invention

The present invention relates to a method of simulating hot carrier deterioration of an MOS transistor, and in particular to a simulation method having an improved accuracy.

2. Description of the Related Art

Hot carrier deterioration of MOS transistors can be evaluated, for example, based on a rate $(\Delta I_D/I_D)$ of a variation $\Delta I_D$ of a drain current to an initial drain current $I_D$ or a variation $\Delta V_{th}$ of a threshold voltage with respect to an initial threshold voltage $V_{th}$.

A method of simulating hot carriers deterioration of an N-MOS transistor is described in *IEEE Trans. Electron Devices*, Vol. 35, pp 1004–1011, July 1988 by Kuo et al.

Under a static hot carrier stress condition by a DC (direct current), the hot carrier deterioration rate $\Delta I_D/I_D$ can be expressed by the following formula (1):

$$\Delta I_D/I_D = A \cdot t^n \qquad (1)$$

where A" represents a coefficient, t represents a hot carrier stress time, and n represents a constant which depends on conditions such as a manufacturing condition of a transistor and a stress condition.

Assuming that a stress time which elapses until the variation rate of drain current attains to $(\Delta I_D/I_D)_f$ is a lifetime of the transistor, the following formula (2) is obtained from the formula (1).

$$(\Delta I_D/I_D)_f = A \cdot \tau_N^n \qquad (2)$$

For example, the time t at the relationship of $(\Delta I_D/I_D)_f =$ 10% is defined as the lifetime $\tau_N$.

According to the above reference (Kuo et al), the lifetime $\tau_N$ of the N-MOS transistor is expressed by the following experimental formula (3) using a substrate current model.

$$\tau_N = W \cdot B \cdot I_{SUB}^{-m} \cdot I_D^{m-1} \qquad (3)$$

where W represents a width of a gate, B represents a coefficient depending on a manufacturing condition of the transistor, $I_{SUB}$ represents a substrate current, and m represents an index which is deemed to be correlated to impact ionization and generation of interface energy levels.

From the formulas (2) and (3), the above coefficient A can be expresses by the following formula (4):

$$A = (\Delta I_D/I_D)_f (W \cdot B \cdot I_{SUB}^{-m} \cdot I_D^{m-1})^{-n} \qquad (4)$$

Therefore, the following formula (5) is obtained from the formulas (1) and (4).

$$\Delta I_D/I_D = (\Delta I_D/I_D)_f (W \cdot B)^{-n} \cdot I_{SUB}^{mn} \cdot I_D^{(1-m)n} \cdot t^n \qquad (5)$$

For simplicity reasons, a definition expressed by the following formula (6) is employed:

$$F_N(t) = (W \cdot B)^{-n} \cdot I_{SUB}^{mn} \cdot I_D^{(1-m)n} \cdot t^n \qquad (6)$$

whereby the formula (5) is rewritten into the following formula (7):

$$\Delta I_D/I_D = (\Delta I_D/I_D)_f F_N(t) \qquad (7)$$

Thus, $F_N(t)$ represents a quantity of the hot carrier stress applied until a time t.

FIG. 19 is a flow diagram showing steps in a method of simulating hot carrier deterioration of an N-MOS transistor using the formula (5). In this flow diagram, a step S1 includes sub-steps S1a–S1e for extracting unknown parameters in the formula (5) by a preliminary experiment.

In the sub-step S1a, which is executed for determining the substrate current $I_{SUB}$ in the formula (3), an experimental formula $I_{SUB} = g(V_G, V_D)$ is determined so that it fits to data related to a plurality of measured points in the preliminary experiment. In the above experimental formula, $V_G$ represents a gate voltage and $V_D$ represents a drain voltage. An example of determining the substrate current $I_{SUB}$ is described in *IEEE Electron Device Lett*, Vol. EDL-5, December 1984, pp 505–507 by Chan et al.

In the sub-step S1b, transistor parameters such as a degree of movement of carries before application of the DC stress as well as a flat band voltage are extracted, for example, using a BSIM (Berkeley Short-Channel IGFET Model) Method, which is specifically described by *IEEE J. Solid-State Circuits*, Vol. SC-22, pp 558–566, August 1987 by Sheu et al. In the subsequent sub-step S1c, the DC stress is applied to the transistor. In the sub-step S1d, the transistor parameters after application of the DC stress are extracted.

Extraction of the transistor parameters before and after application of the DC stress is required for coinciding characteristics of the transistor before application of the stress with characteristics of the transistor obtained by simulation, and is also required for estimating correlation between the actual hot carrier deterioration of the transistor after application of the stress and variation of the transistor parameters.

In the sub-step S1e, the coefficient B and index m are extracted based on comparison of the experimental formula (3) and data related to a plurality of measured points in the preliminary experiment.

In a step 2, the formula (5) is calculated using the parameters extracted in the step S1, whereby the hot carrier deterioration of the N-MOS transistor is simulated.

According to the simulation in the prior art described above, the index n in formula (5) is treated as a constant. The value of index n can be obtained by plotting the hot carrier deterioration, which is caused by application of the DC stress in the sub-step S1c in FIG. 19, based on the formula (1) in a manner shown in FIG. 20. In FIG. 20, the abscissa represents log(t) and the ordinate represents $\log(\Delta I_D/I_D)$. For example, the value of index n in the formula (1) can be obtained, for example, from a gradient of straight line connecting data indicated by "x" marks of at least two measured points in the preliminary experiment.

According to the simulation in the prior art, however, the index n which is once determined in the preliminary experiment will be treated as a constant. In the case where the index n actually changes depending the stress condition, therefore, an precise result cannot be obtained when simulating the hot carrier deterioration of the MOS transistor by application of the DC stress which is different from that in the sub-step S1c for extracting transistor parameters.

Also in the case where AC (alternate current) is applied and thereby the stress condition changes depending on the time, a sufficiently precise result cannot be obtained in the conventional simulation in which the index n is treated as a constant.

SUMMARY OF THE INVENTION

Accordingly, it is an object of the invention to provide a method, in which the fact that the index n depends on the stress condition is taken into consideration, and the hot carrier deterioration of a MOS transistor can be precisely simulated under not only the DC stress but also the AC stress, According to an aspect, the invention provides a method of simulating hot carrier deterioration of an N-MOS transistor utilizing following formulas (6) and (7):

$$F_N(t) = (W \cdot B)^{-n} \cdot I_{SUB}^{mn} I_D^{(1-m)n} \cdot t^n \quad (6)$$

$$\Delta I_D/I_D = (\Delta I_D/I_D)_f F_N(t) \quad (7)$$

where $F_N(t)$ represents a quantity of a hot carrier stress applied until a time t, W represents a width of a gate of the transistor, B represents a coefficient depending on a manufacturing condition of the transistor, $I_{SUB}$ represents a substrate current, $I_D$ represents a drain current, m represents an index which is deemed to be correlated to impact ionization and generation of interface energy levels, and $(\Delta I_D/I_D)_f$ represents a rate of a variation $\Delta I_D$ of the drain current at the time of expiration of a lifetime of the transistor to an initial value of the drain current $I_D$, wherein n is not a constant but is expressed as a function $n=g(V_G, V_D)$ of a gate voltage $V_G$ and a drain voltage $V_D$ which are applied at the time of the hot carrier stress, and the function is determined by a preliminary experiment.

According to another aspect, the invention provides a method of simulating hot carrier deterioration of a P-MOS transistor utilizing following formulas (20) and (21):

$$F_P(t) = B^{-n} \cdot W^{-mn} \cdot I_G^{mn} \cdot t^n \quad (20)$$

$$\Delta I_D/I_D = (\Delta I_D/I_D)_f F_P(t) \quad (21)$$

where $F_P(t)$ represents a quantity of a hot carrier stress applied until a time t, B represents a coefficient depending on a manufacturing condition of the transistor, W represents a width of a gate of the transistor, $I_G$ represents a gate current, m represents an index which deemed to be correlated to impact ionization and generation of interface energy levels, and $(\Delta I_D/I_D)_f$ represents a rate of a variation $\Delta I_D$ of the drain current at the time of expiration of a lifetime of the transistor to an initial value of the drain current $I_D$, wherein n is not a constant but is expressed as a function $n=g(V_G, V_D)$ of a gate voltage $V_G$ and a drain voltage $V_D$ which are applied at the time of the hot carrier stress, and the function is determined by a preliminary experiment.

According to the method of simulating the hot carrier deterioration of the MOS transistor of the invention, since the index n is not a constant but is given by the experimental formula $n=g(V_G, V_D)$ depending on the stress condition, an accuracy can be higher than that of the simulation in the prior art, and the hot carrier deterioration by not only the DC stress but also the AC stress can be precisely simulated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
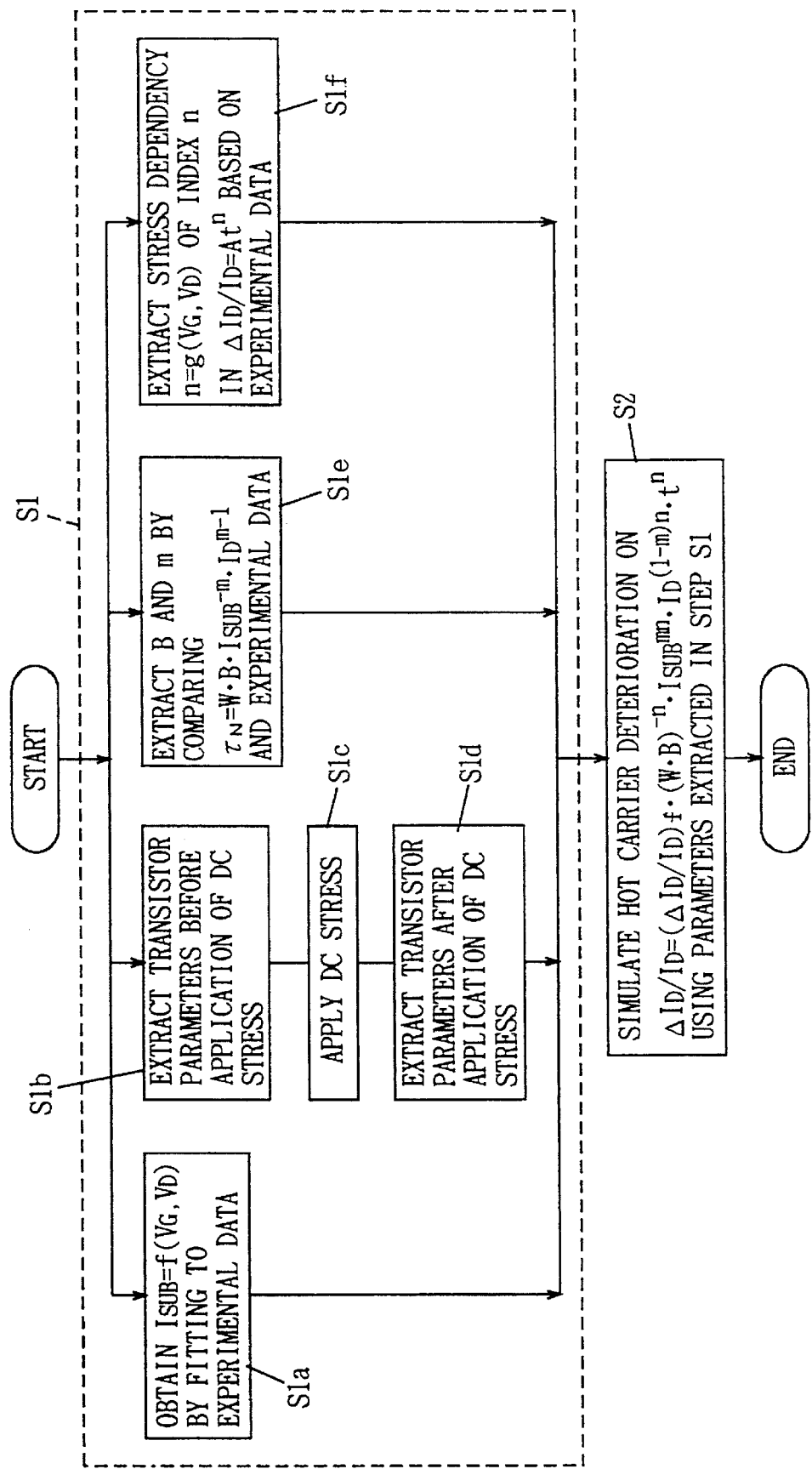
FIG. 1 is a flow diagram showing steps of simulating hot carrier deterioration of an N-MOS transistor according to an embodiment of the invention.
Figure 19:
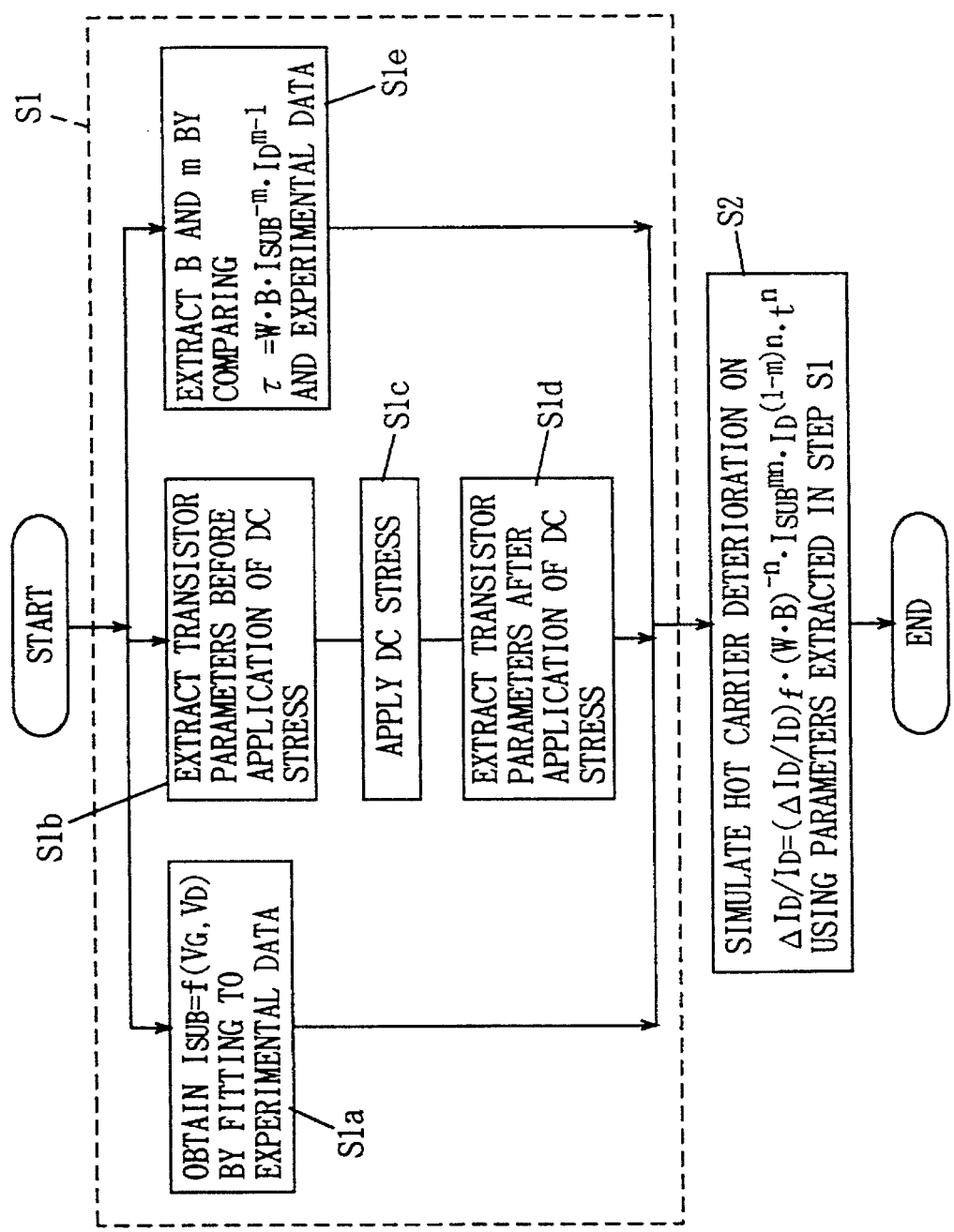
FIG. 19 is a flow diagram showing steps in a conventional simulation method related to hot carrier deterioration of an N-MOS transistor.
Figure 20:
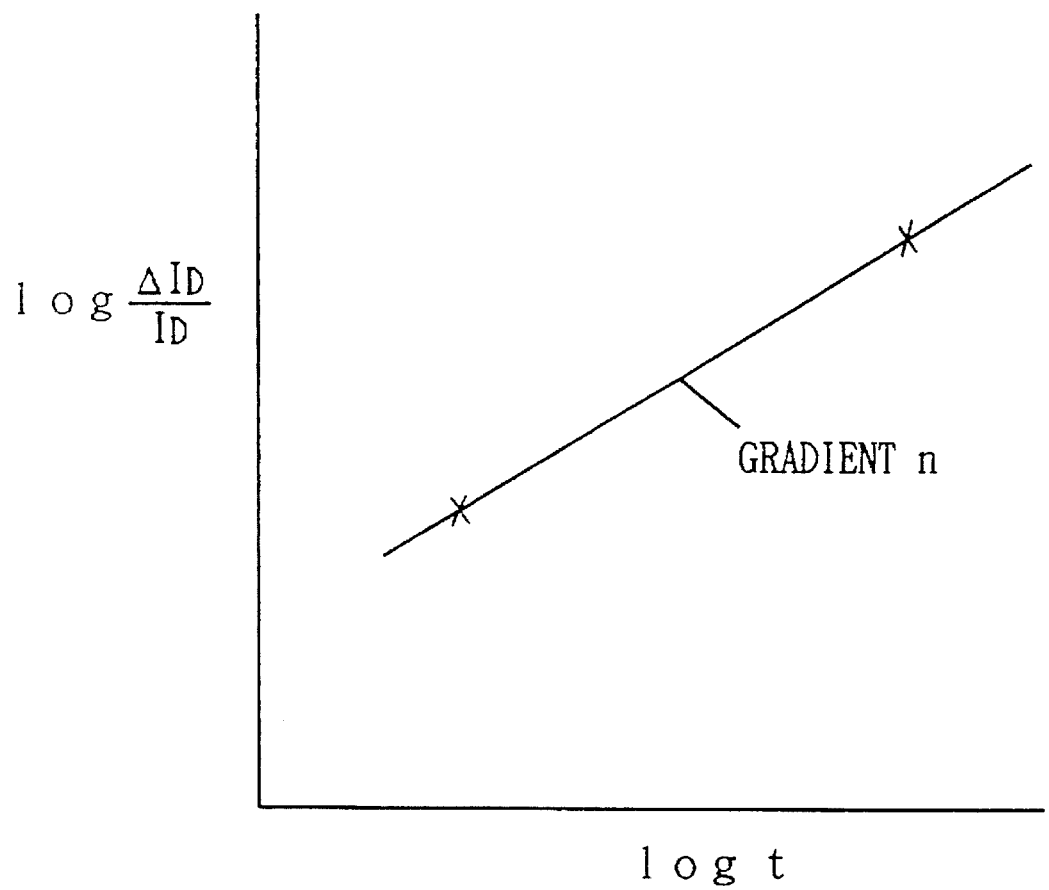
FIG. 20 is a graph showing a method of obtaining an index n in a step S2 in FIG. 19.

In a flow diagram of FIG. 1, there are shown steps of simulating hot carrier deterioration of an N-MOS transistor of an embodiment of the invention. The flow diagram of FIG. 1 is similar to that of FIG. 19, but differs therefrom in that a step S1 additionally includes a sub-step S1f.

Figure 2:
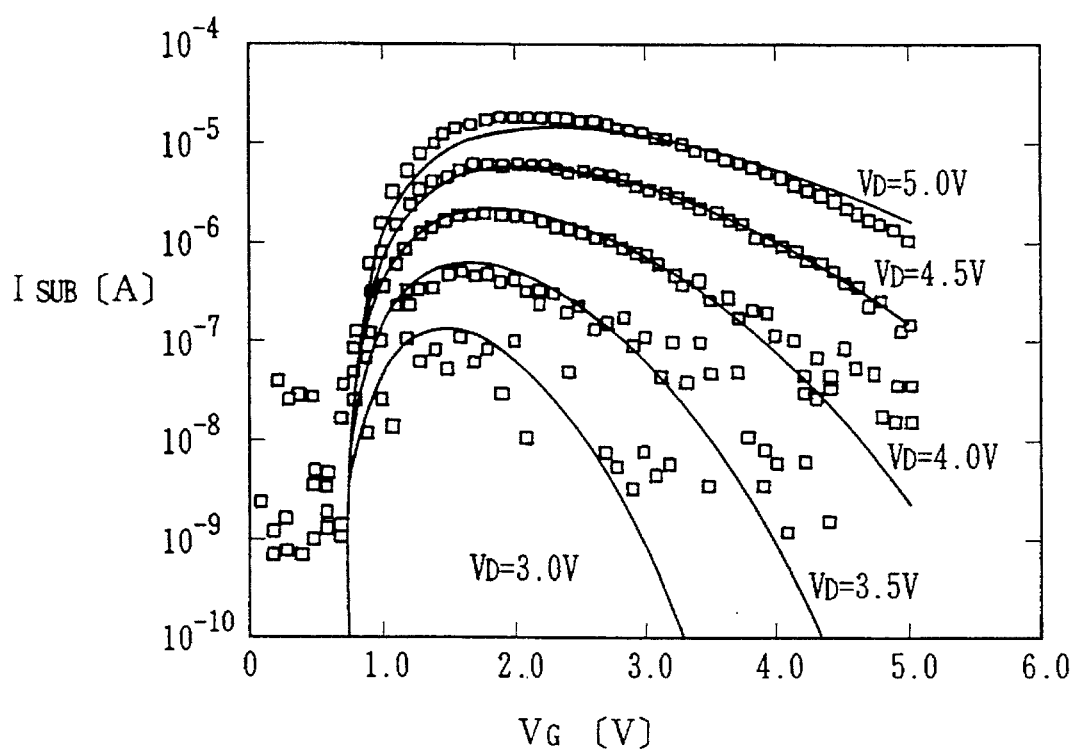
FIG. 2 is a graph representing $I_{SUB}=f(V_G, V_D)$ obtained in a sub-step S1a in FIG. 1.

Referring to FIG. 2, there is shown an example of relationship between an experimental formula $I_{SUB}=f(V_G, V_D)$ determined in the sub-step S1a in FIG. 1 and preliminary experimental data. In this graph, the abscissa represents a gate voltage $V_G$ [V (volt)] and the ordinate represents a substrate current $I_{SUB}$ [A (ampere)]. Square marks represent measured data in the preliminary experiment, and show relationship between the gate voltage $V_G$ and substrate current $I_{SUB}$ under the drain voltage $V_D$ of various values. Curved solid linea represent the experimental formula $I_{SUB}=f(V_G, V_D)$. Thus, the experimental formula $I_{SUB}=f(V_G, V_D)$ is determined so as to achieve better fit to the preliminary experimental data, for example, in accordance with the method proposed by Chan et al. In the embodiment, all the preliminary experimental data relate to the N-MOS transistor provided with a gate of 1.0 μm in length and 10 μm in width.

Figure 3:
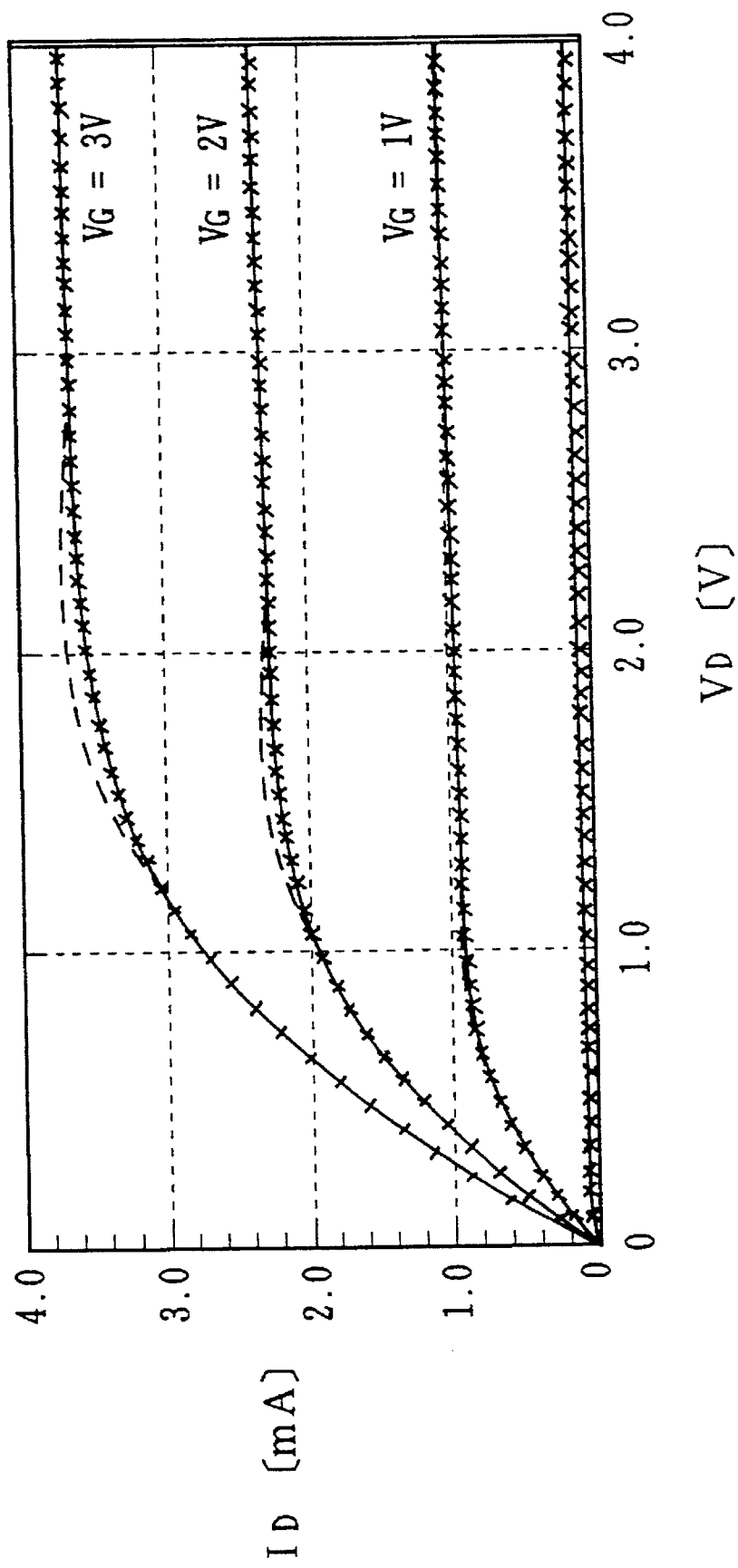
FIG. 3 is a graph showing a result of simulation by a BSI method for extracting transistor parameters before application of a DC stress in a sub-step S1b in FIG. 1.

Referring to FIG. 3, there is shown an example of a result of simulation by the BSIM method for extracting transistor parameters before application of the DC stress in the sub-step S1b in FIG. 1. In the graph of FIG. 3, the abscissa represents a drain voltage $V_D$ [V] and the ordinate represents $I_D$ [mA (mili-ampere)]. Curved solid lines connecting "x" marks represent $V_D$-$I_D$ characteristics of the transistor under the gate voltage $V_G$ of various values. Curved broken lines represent results of simulation by the BSIM method using transistor parameters extracted to fit to the curved solid lines.

The sub-step S1c in FIG. 1 is carried out to measure the drain current $I_D$ and others under the distinctive operation condition of the actual transistor before application of the DC stress, i.e., the condition of $V_D$=0.2 V and $V_G$=3.3 V or the condition of $V_D$=3.3 V and $V_G$=3.3 V. Thereafter, the drain voltage $V_D$ is increased and the DC stress maximizing the substrate current is applied for a predetermined time period. Thereafter, the drain current $I_D$ and others are measured under the distinctive operation condition of the transistor, i.e., the condition of $V_D$=0.2 V and $V_G$=3.3 V or condition of $V_D$=3.3 V and $V_G$=3.3 V. Thereafter, one repetitively carries out operations of applying the DC stress for a predetermined time period and subsequent measurement of the drain current $I_D$ and others, and thereby measures deterioration of the drain current $I_D$ and others depending on the stress time.

In the sub-step S1d in FIG. 1, the transistor parameters are obtained for the transistor, in which the hot carrier deterioration occurs due to application of the DC stress, in a manner similar to the BSIM method in the step S1b.

Figure 4:
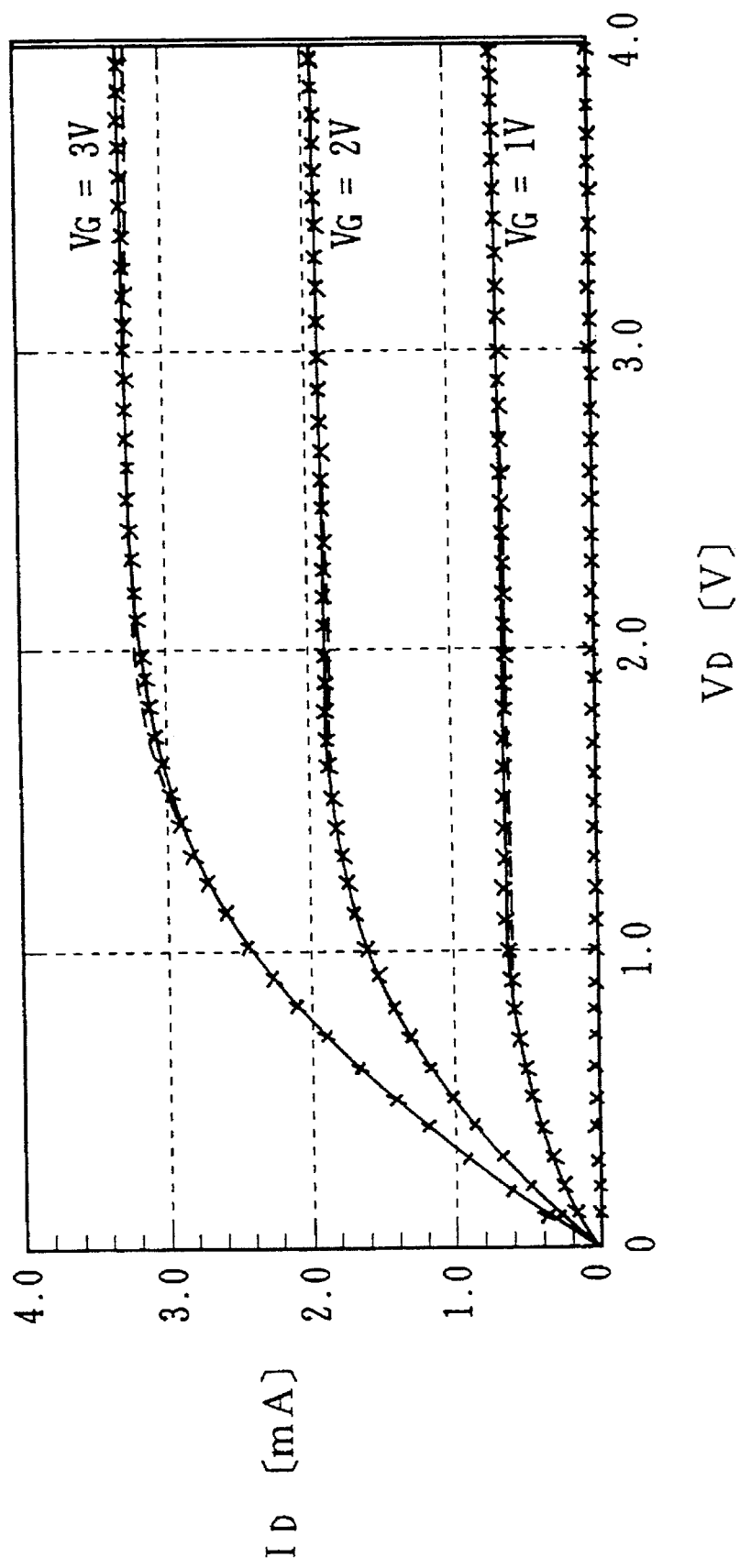
FIG. 4 is a graph showing a result of simulation by a BISM method for extracting transistor parameters after application of a DC stress in a sub-step S1d in FIG. 1.

FIG. 4 is similar to FIG. 3 but shows a result of simulation by the BSIM method after application of the DC stress for 1000 seconds. As can be seen from comparison between FIGS. 3 and 4, the drain current $I_D$ after application of the DC stress is smaller than that before application of the DC stress. An experimental formula expressing time-dependency of extracted transistor parameters are determined based on FIGS. 3 and 4 and others.

Figure 5:
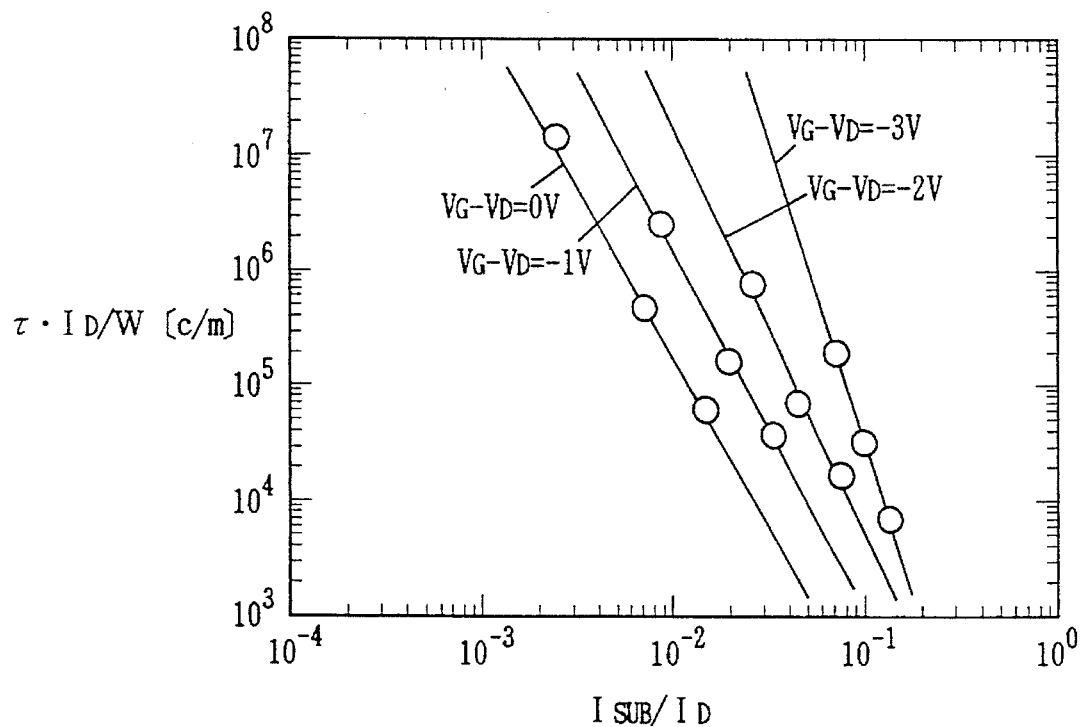
FIG. 5 is a graph showing preliminary experimental data for extracting a coefficient B and an index m in a sub-step S1e in FIG. 1.

Referring to FIG. 5, there are shown data of the preliminary experiment for extracting the coefficient B and index m in the sub-step S1e in FIG. 1. In the graph of FIG. 5, the abscissa represents $I_{SUB}/I_D$, and the ordinate represents $\tau \cdot I_D/W$ [C/m]. A plurality of straight lines each connecting measured points indicated by circle marks represent the relationship between $I_{SUB}/I_D$ and $\tau_N \cdot I_D/W$ under the gate-drain voltage $V_{GD}=V_G-V_D$ of various values. The formula (3) can be rewritten into the following formula (8):

$$\log (\tau_N \cdot I_D/W) = -m \cdot \log (I_{SUB}/I_D) + \log (B) \quad (8)$$

Thus, the gradient of straight lines in FIG. 5 represent $-m$, and the values on the ordinate corresponding to $\log(I_{SUB}/I_D)=0$ represent values of $\log(B)$.

Figure 6:
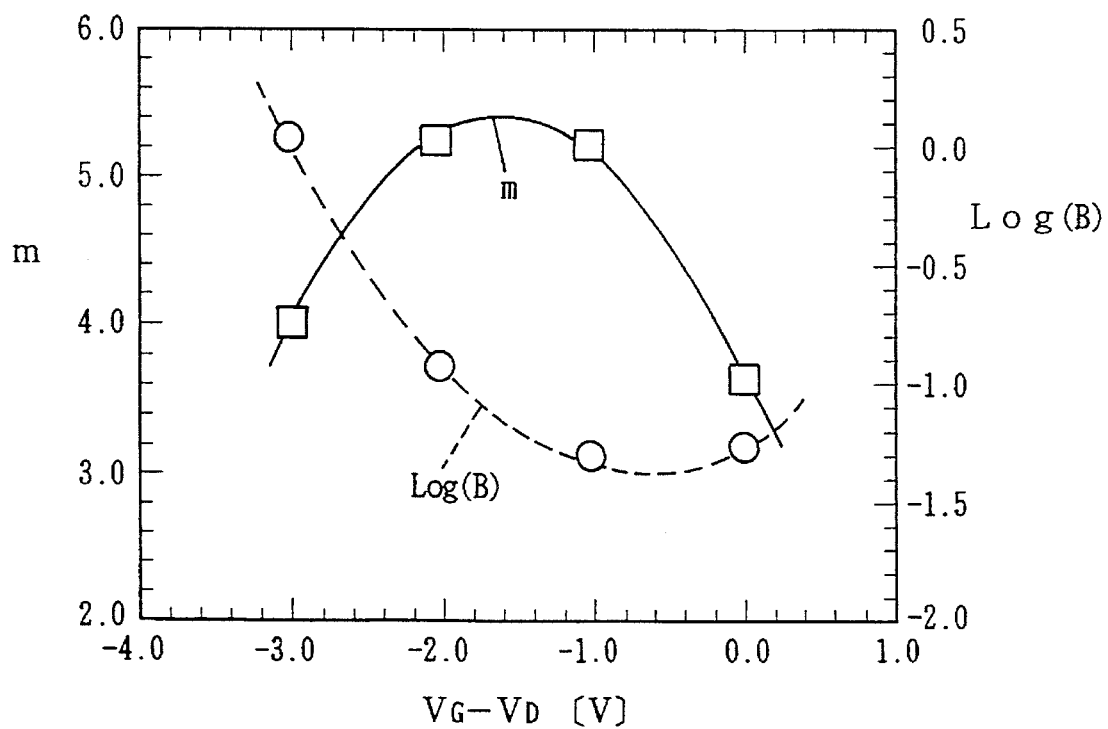
FIG. 6 is a graph showing log (B) and m extracted from the preliminary experimental data in FIG. 5.

Referring to FIG. 6, there are shown m and log(B) obtained from FIG. 5. In the graph of FIG. 6, the abscissa represents the gate-drain voltage $V_{GD}=V_G-V_D$, the left ordinate represents m, and right ordinate represents log(B). As can be seen from FIG. 6, values of m and log(B) depend on the gate voltage $V_G$ and drain voltage $V_D$ during application of the DC stress and can be expressed as quadratic functions of the gate-drain voltage $V_{GD}$. In the example in FIG. 5, m and log(B) can be expressed by the following formulas (9) and (10), respectively:

$$m=3.14+0.52V_{GD}+0.40V_{GD}^2 \quad (9)$$

$$\log (B)=-0.97-1.40V_{GD}-0.44V_{GD}^2 \quad (10)$$

Figure 7:
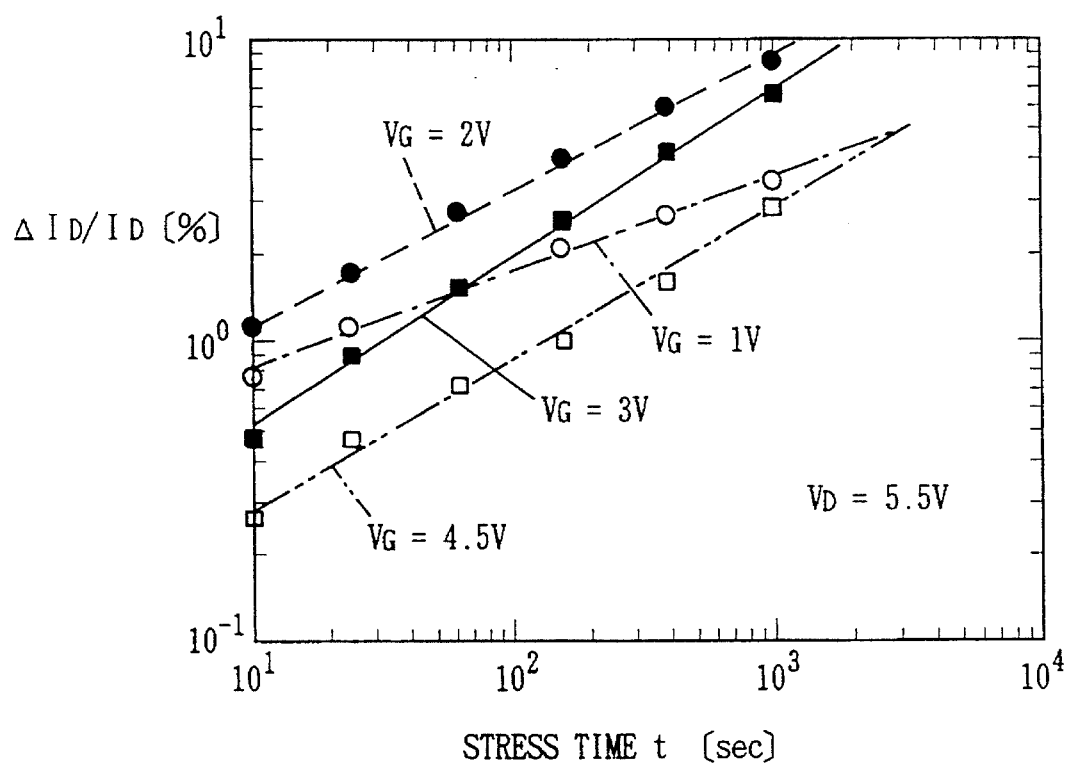
FIG. 7 is a graph showing preliminary experimental data for extracting $n=g(V_G, V_D)$ in a sub-step S1f in FIG. 1.

Referring to FIG. 7, there are shown preliminary experimental data for determining $n=g(V_G, V_D)$ in the sub-step S1f in FIG. 1. In the graph of FIG. 7, the abscissa represents the stress time [sec] and the ordinate represents the hot carrier deterioration rate $\Delta I_D/I_D$ [%]. This preliminary experiment is executed with the drain voltage $V_D$=5.5 V, and a plurality of straight lines represent the relationship between the stress time t and hot carrier deterioration rate $\Delta I_D/I_D$ under the gate voltage $V_G$ of various values. As can be understood from the formula (1), the gradients of lines in FIG. 7 correspond to the index n in the formula (1).

Figure 8:
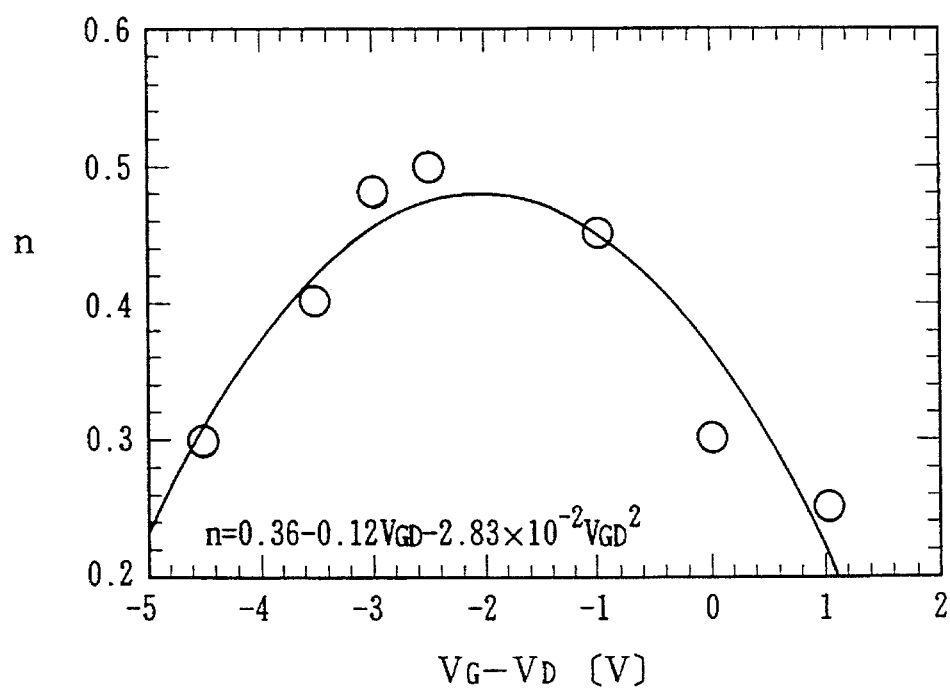
FIG. 8 is a graph showing $n=g(V_G, V_D)$ extracted from the preliminary experimental data in FIG. 7.

FIG. 8 represents n obtained on the basis of the graph in FIG. 7. In the graph of FIG. 8, the abscissa represents the gate-drain voltage $V_{GD}=V_G-V_D$, and the ordinate represents n. As can be seen from FIG. 8, n is not constant, but changes depending on the gate voltage $V_G$ and drain voltage $V_D$ during application of the DC stress. In the example in FIG. 8, n can be expressed by the following quadratic function (11):

$$n=a+b \cdot V_{GD}+c \cdot V_{GD}^2 \quad (11)$$

In the case of FIG. 8, the formula (11) can be changed into the following formula (12):

$$n=0.36-0.12V_{GD}-2.83\times10^{-2}V_{GD}^2 \quad (12)$$

where n can be expressed by not only the formula (11) but also another equivalent formula.

Figure 9:
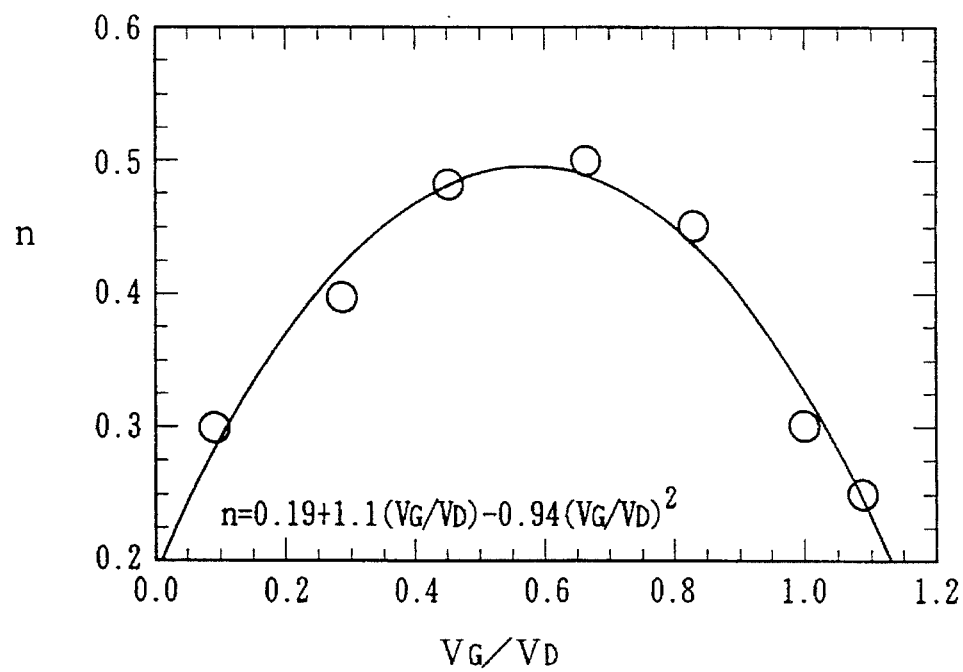
FIG. 9 is a graph obtained by changing the abscissa $(V_G-V_D)$ in FIG. 8 into $(V_G/V_D)$.

FIG. 9 represents n obtained in FIG. 7 as a function of $(V_G/V_D)$ instead of $(V_G-V_D)$. Thus, in the graph of FIG. 9, the abscissa represents $V_G/V_D$ and the ordinate represents n. Curved line in FIG. 9 can be expressed by the following formula (13):

$$n=a+b \cdot (V_G/V_D)+c \cdot (V_G/V_D)^2 \quad (13)$$

In the example of FIG. 9, the formula (13) can be changed into the following formula (14):

$$n=0.19+1.1(V_G/V_D)-0.94(V_G/V_D)^2 \quad (14)$$

As described above, the hot carrier deterioration rate $\Delta I_D/I_D$ is calculated on the basis of the formula (5) in the step S2 using various parameters obtained in the step S1.

Figure 10:
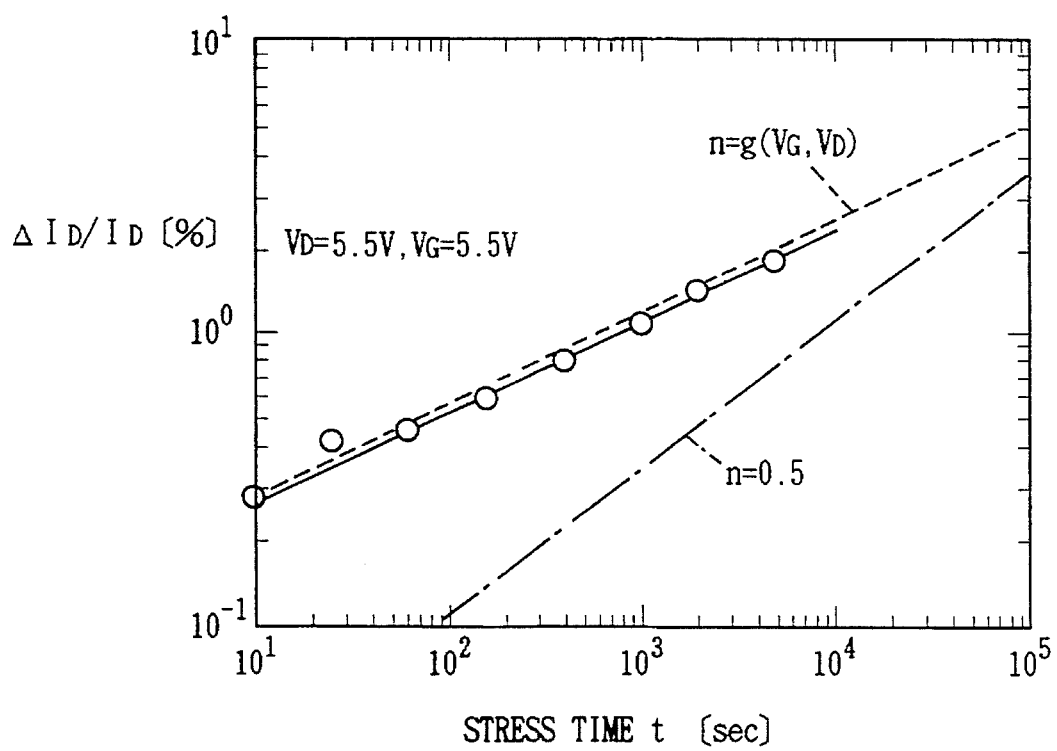
FIG. 10 is a graph showing comparison between accuracies of simulation relating to an N-MOS transistor of an embodiment of the invention and simulation in the prior art.

FIG. 10 shows, for comparison, the results of simulation in the embodiment of the invention together and in the prior art. In the graph of FIG. 10, the abscissa represents the stress time t [sec] and the ordinate represents the hot carrier deterioration rate $\Delta I_D/I_D$ [%]. The stress condition of $V_D$=5.5 V and $V_G$=5.5 V is employed. Solid lines represent the measured data, and dotted lines represent the simulation result of the embodiment. Alternate long and short dash lines represent the result by the conventional simulation method. In the conventional simulation method, the value of n is generally determined under the condition that the substrate current $I_{SUB}$ attains a maximum value, and is generally in a rage from 0.50 to 0.55. In the simulation of the embodiment, n is determined by the function $n=g(V_G, V_D)$. In the case shown in FIG. 10, the condition of $V_D=5.5$ V and $V_G=5.5$ V is employed so that $n=0.36$ is used on the basis of the formula (12). As can be seen from FIG. 10, the simulation of the embodiment utilizing the value of n, which is determined depending on the gate voltage $V_G$ and drain voltage $V_D$, can achieve the accuracy higher than that of the simulation method in the prior art.

Figure 11:
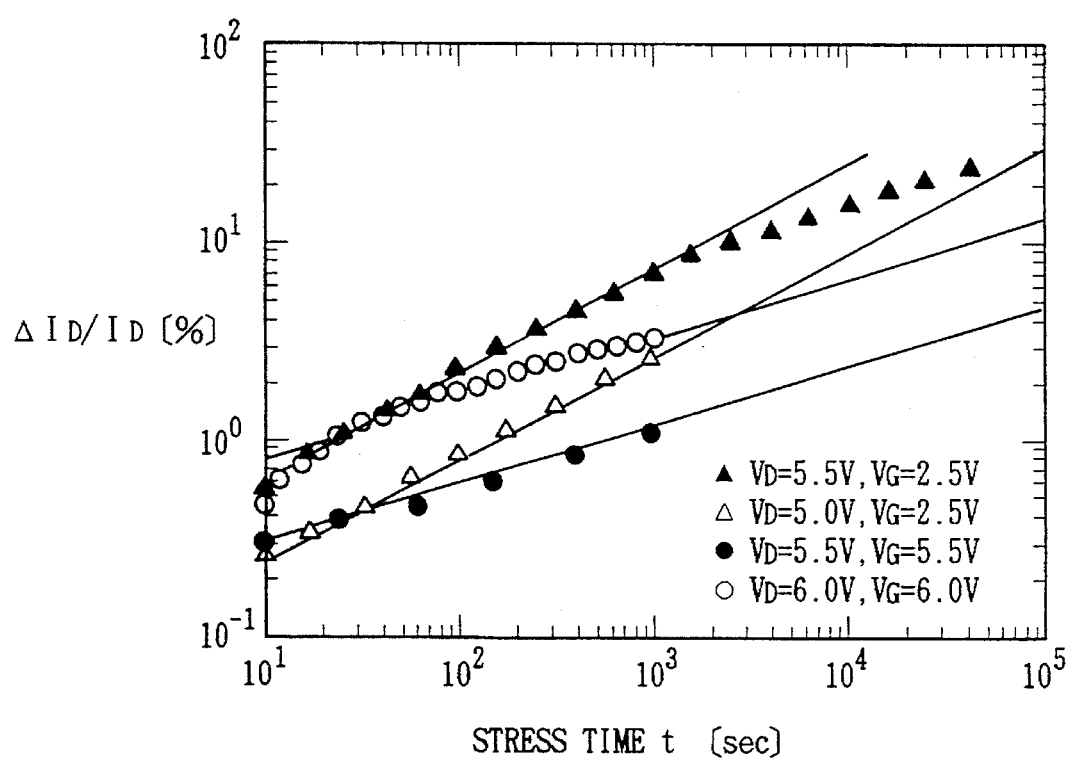
FIG. 11 is a graph showing results of simulation relating to the N-MOS transistor of the invention under various DC stress conditions.

FIG. 11 is similar to FIG. 10, but shows the simulation result of the embodiment under the drain voltage $V_D$ of various values and the gate voltage $V_G$ of various values. In the graph of FIG. 11, solid triangle marks, hollow triangle marks, solid circle marks and hollow circle marks represent measured data, and solid lines represent simulation results of the embodiment. As can be seen from this figure, the embodiment can provide high accuracy in simulation of the hot carrier deterioration rate $\Delta I_D/I_D$ even if the DC stress condition changes in various manners.

According to the simulation method of the invention, as described above, the hot carrier deterioration $\Delta I_D/I_D$ can be precisely estimated even under the gate voltage $V_G$ of various values and the drain voltage $V_D$ of various values. Therefore, the hot carrier deterioration can be precisely estimated under the AC stress, i.e., the condition where the gate voltage $V_G$ and drain voltage $V_D$ change depending on the time.

The simulation under the AC stress can be executed utilizing the following formulas (15) and (16):

$$F_{NAC}(t)=\int\{\delta F_N(t)/\delta t\}dt \qquad (15)$$

$$\Delta I_D/I_D=(\Delta I_D/I_D)_f F_{NAC}(t) \qquad (16)$$

where $F_{NAC}(t)$ represents a stress quantity after application of the AC stress for the time of t.

In the case of AC stress, i.e., in the case where the hot carrier stress condition cyclically changes depending on the time, the following formulas (17) and (18) can be utilized instead of the formulas (15) and (16):

$$F_{Nr}(t)=\int_0^T r^n\left\{\frac{\delta F_N(t)}{\delta t}\right\}dt \qquad (17)$$

$$\frac{\Delta I_D}{I_D}=\left(\frac{\Delta I_D}{I_D}\right)_f \cdot F_{Nr}(t) \qquad (18)$$

where $F_{Nr}(t)$ represents the stress quantity after application of the AC stress having a cycle of T for the time of t, and r represents a frequency.

Figure 12:
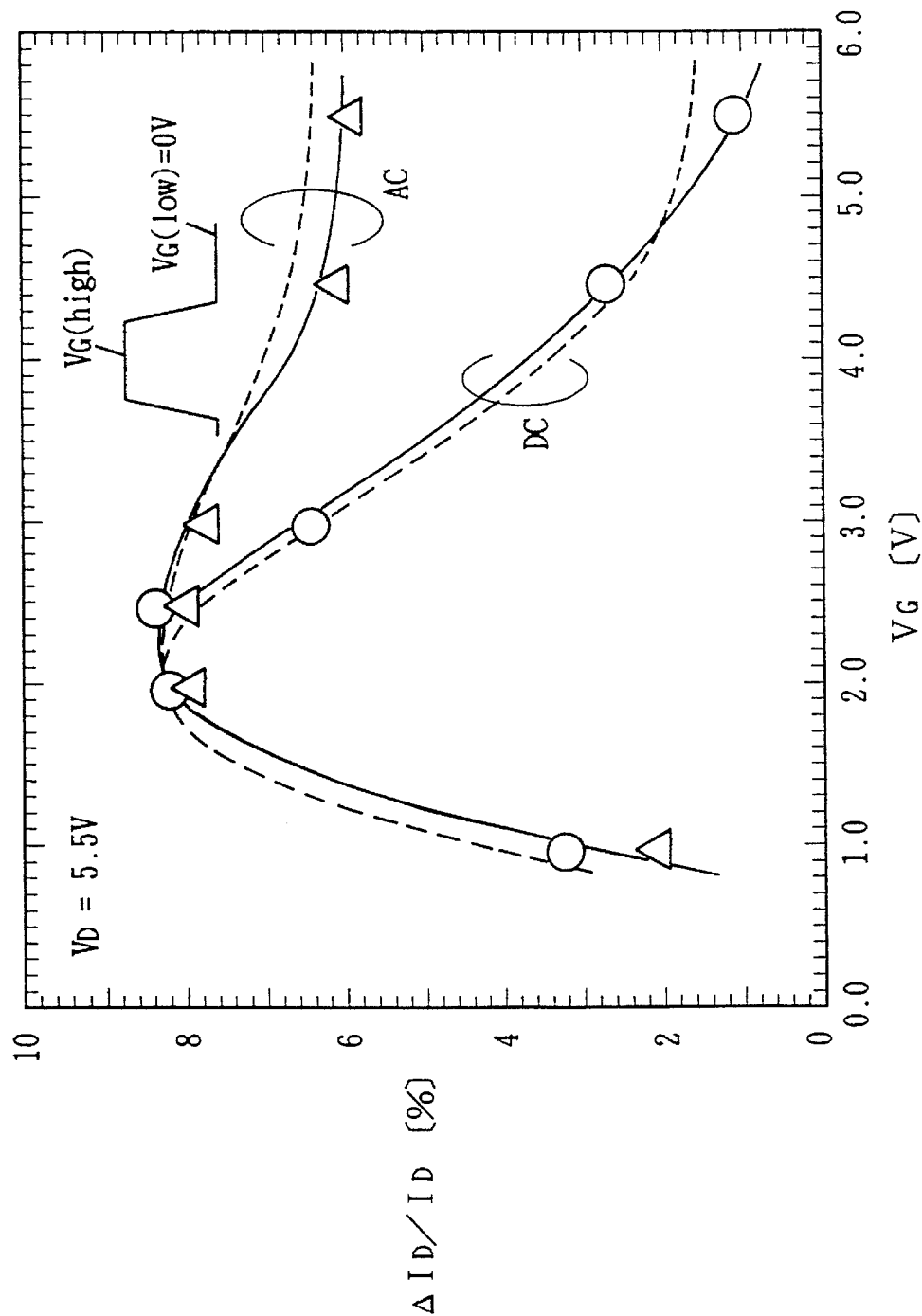
FIG. 12 is a graph showing a hot carrier deterioration rate $\Delta I_D/I_D$ relating to an N-MOS transistor after application of a DC or AC stress for 1000 seconds.

Referring to FIG. 12, there is shown a relationship between the simulation and experimental data of the hot carrier deterioration rate $\Delta I_D/I_D$ after application of the DC or AC stress for 1000 seconds. In the graph of FIG. 12, the abscissa represents the gate voltage $V_G$ [V] and the ordinate represents the hot carrier deterioration rate $\Delta I_D/I_D$ [%]. In the case of DC stress, the gate voltage $V_G$ represented on the abscissa is applied. Under the AC stress, the gate voltage $V_G$ varies in the form of a square wave between the low level of 0 V and the high level of a value represented on the abscissa. The square wave has a frequency of 10 kHz and a duty ratio of 10%, and rising and falling times thereof each are 5 microseconds. The drain voltage $V_D$ of 5.5 V is used in both the cases of DC and AC stresses. As can be understood from FIG. 12, the hot carrier deterioration rate $\Delta I_D/I_D$ can be precisely estimated under any stress condition according to the simulation of the invention.

Simulation of another embodiment of the invention will be described below.

In the case of the P-MOS transistor, the gate current model is utilized instead of the above substrate current model, as described in *IEEE Trans. Electron Devices*, Vol. 37, pp 1658–1666, July 1990 by Ong et al. Thus, the following formula (19) is used instead of the formula (3), and the following formula (20) is used instead of the formula (6).

$$\tau_P=B\cdot W^m\cdot I_G^{-m} \qquad (19)$$

$$F_P(t)=B^{-n}\cdot W^{-mn}\cdot I_G^{mn}\cdot t^n \qquad (20)$$

where $\tau_P$ represents a lifetime of the P-MOS transistor, and $F_P(t)$ represent a stress quantity at the time t. The hot carrier deterioration rate $\Delta I_D/I_D$ of the P-MOS transistor is expressed by the following formula (21):

$$\Delta I_D/I_D=(\Delta I_D/I_D)_f F_P(t) \qquad (21)$$

Steps of simulation for the P-MOS transistor are basically similar to those shown in FIG. 1, but the sub-steps S1a and S1e and the step S2 are partially changed.

In the sub-step S1a in FIG. 1, the substrate current $I_{SUB}$ is not obtained but the gate current $I_G$ is obtained using a lucky electron model. The method of obtaining the gate electrode $I_G$ using the lucky electron model is described in *IEEE Trans. Electron Devices*, Vol. ED-31, pp 1116–1125, September 1984 by Tam et al.

Figure 13:
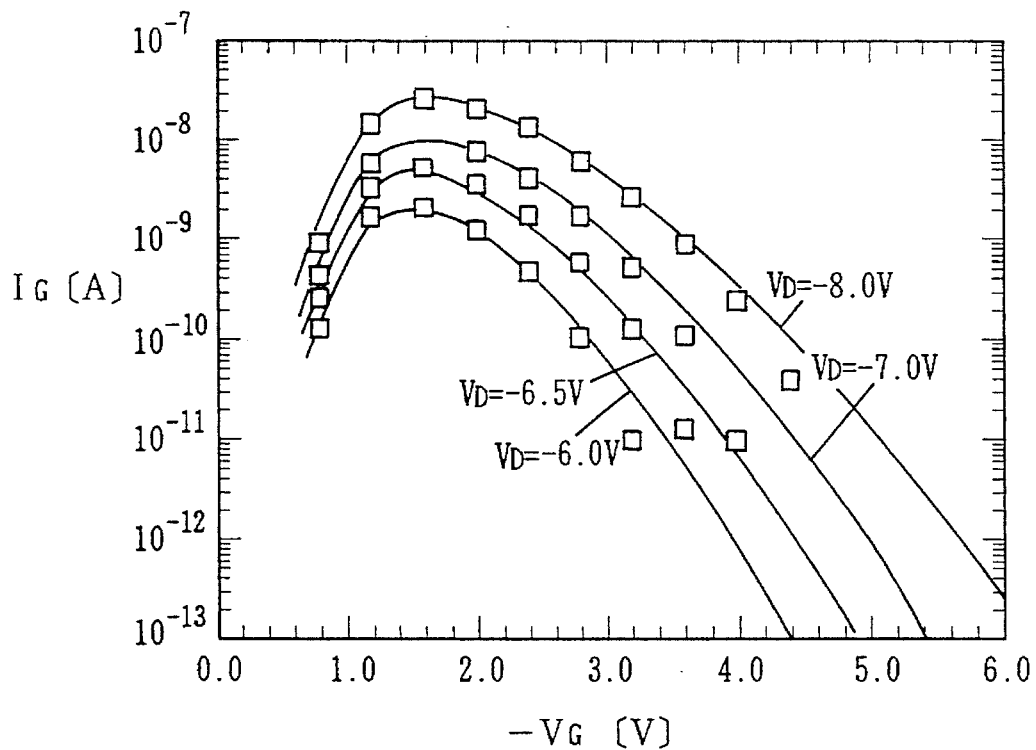
FIG. 13 is a graph showing a function $I_G=f(V_G, V_D)$ fitted to a gate current, which is obtained from a preliminary experimental data, in simulation related to a P-MOS transistor.

Referring to FIG. 13, there is shown a relationship between the preliminary experimental data obtained for the P-MOS transistor and the function $I_G=f(V_G, V_D)$ fitted thereto. In the graph of FIG. 13, the abscissa represents the gate voltage $-V_G$ [V] and the ordinate represents the gate current $I_G$ [A]. Square marks represent preliminary experimental data under the drain voltage of various values, and curved solid lines represent functions $I_G=f(V_G, V_D)$ fitted to those preliminary experimental data.

Figure 14:
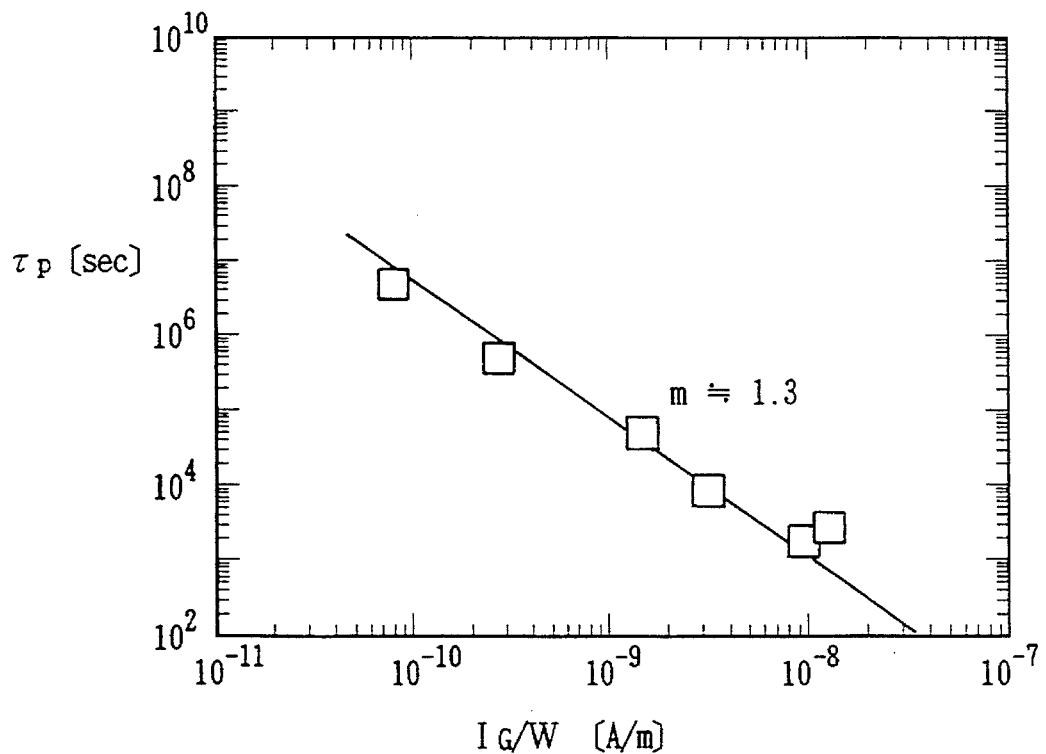
FIG. 14 is a graph showing preliminary experimental data for determining an index m and a coefficient B in a formula (19)

Referring to FIG. 14, the coefficient B and index m in the formula (19) are extracted instead of those in the formula (3) in the sub-step S1e in FIG. 1. In the graph of FIG. 14, the abscissa represents $I_G/W$ [A/m], and the ordinate represents $\tau_P$ [sec]. The gradient of straight line connecting measured points represents $-m$, and the value on the ordinate through which the straight line passes in the case of $\log\{I_G/W\}=0$ corresponds to $\log(B)$.

Figure 15:
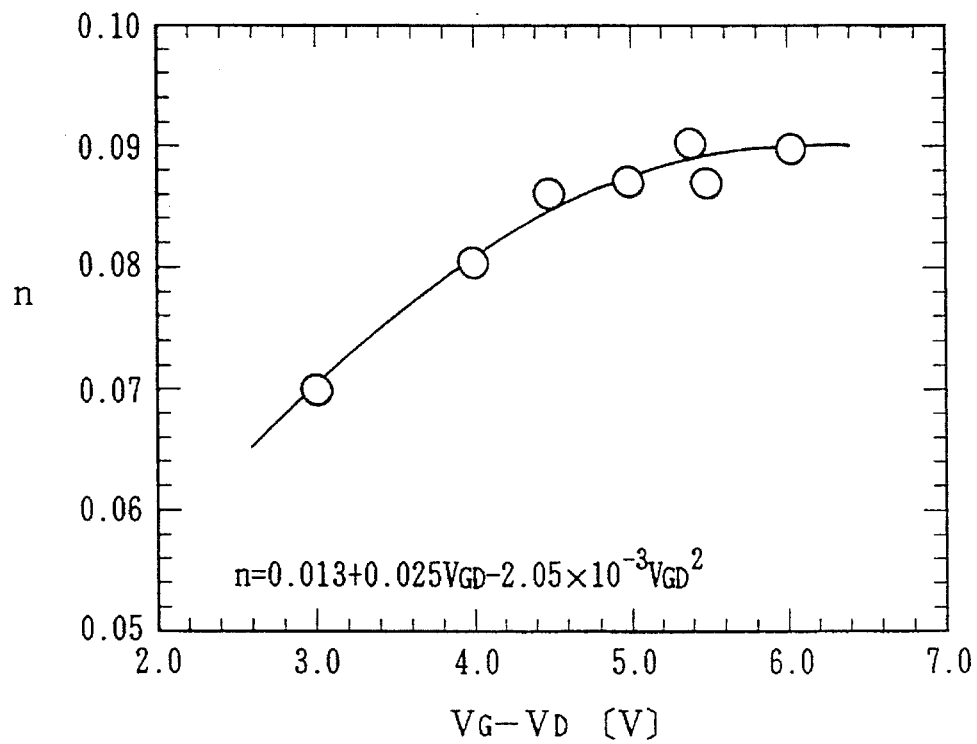
FIG. 15 is a graph showing a function $n=g(V_G, V_D)$ obtained in connection with the P-MOS transistor.

FIG. 15 represents n obtained for the P-MOS transistor. In this graph, the abscissa represents the gate-drain voltage $V_{GD}=V_G-V_D$, and the ordinate represents n. In the example shown in FIG. 15, n can be expressed by the following formula (22):

$$n=0.013+0.025V_{GD}-2.05\times10^{-3}V_{GD}^2 \qquad (22)$$

Figure 16:
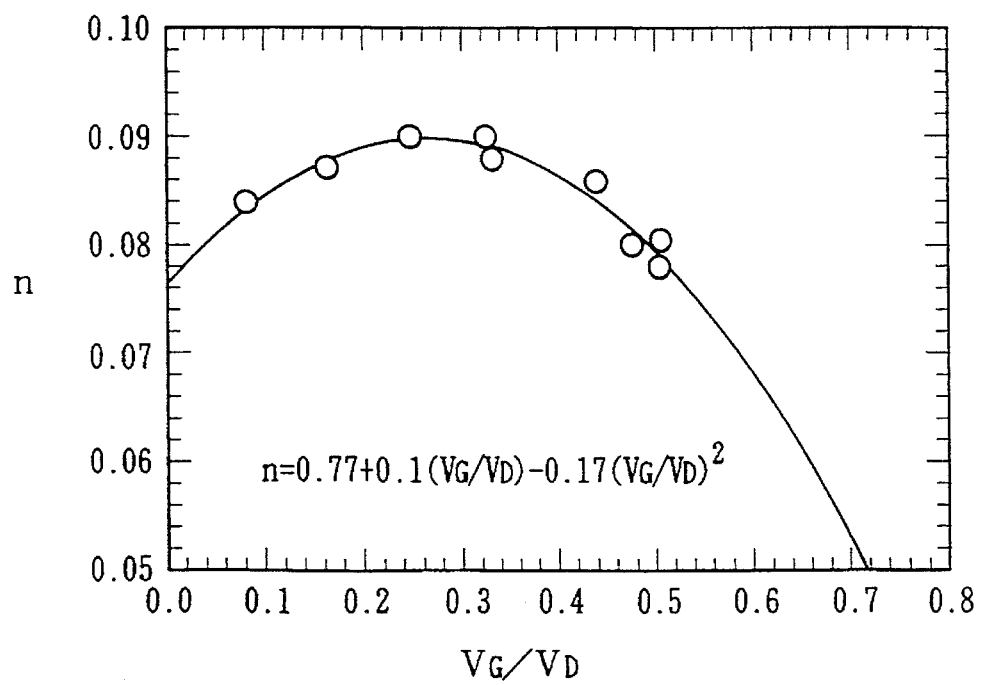
FIG. 16 is a graph obtained by changing an abscissa $(V_G-V_D)$ in FIG. 15 into $(V_G/V_D)$.

FIG. 16 is similar to FIG. 15, but the abscissa in FIG. 16 represents $V_G/V_D$. In the example in FIG. 16, n is expressed by the following formula (23):

$$n=0.77+0.1(V_G/V_D)-0.17(V_G/V_D)^2 \qquad (23)$$

The hot carrier deterioration is simulated not by the formula (5) but by the formula (21) in the step S2 in FIG. 1 using the parameters which are extracted in connection with the P-MOS transistor as described above.

Figure 17:
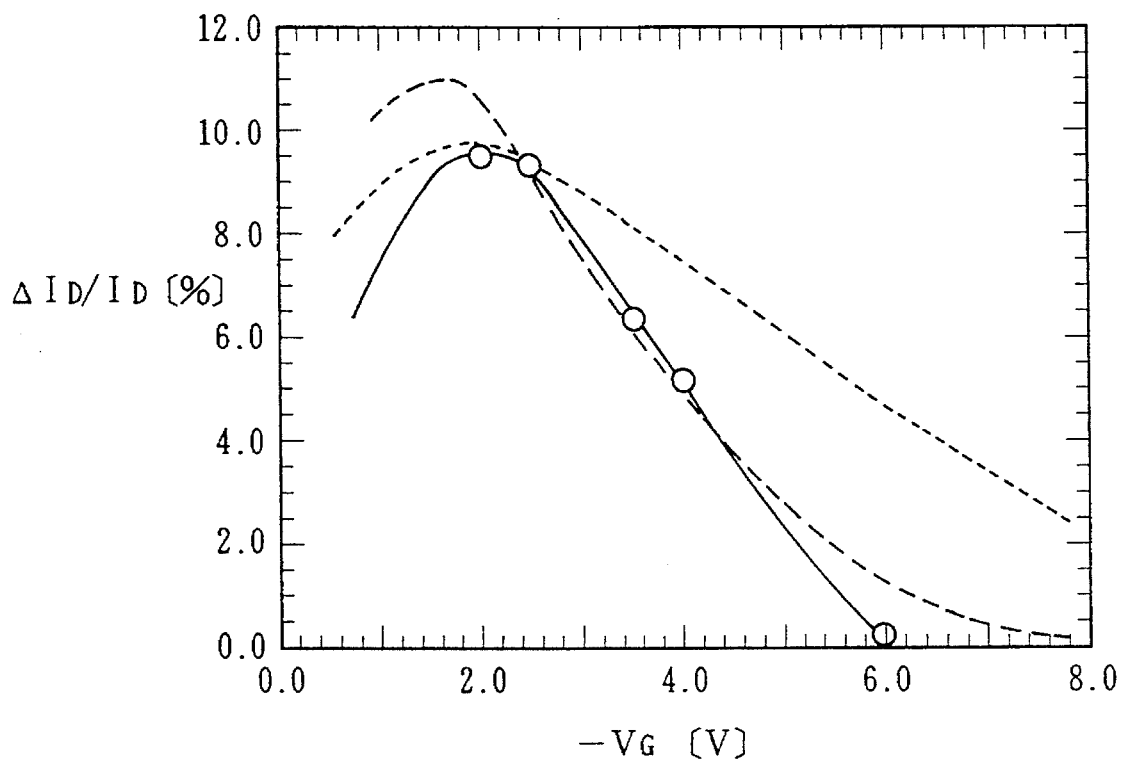
FIG. 17 is a graph for comparison between results of simulation based on a substrate current model related to the P-MOS transistor and simulation based on a gate current model.

In FIG. 17, there is shown the result of simulation related to the P-MOS transistor. In this graph, curved solid line represents experimental data, curved broken line represents simulation using the formula (21) based on the gate current model, and curved dotted line represents simulation using the formula (6) based on the substrate current model. As can be seen from this figure, the simulation for the P-MOS transistor can be carried out more precisely by using the formula (21) instead of the formula (7).

According to the invention, simulation even for the P-MOS transistor can be precisely carried out under the DC and AC stresses of various conditions similarly to the case of the N-MOS transistor. The simulation of hot carrier deterioration rate $\Delta I_D/I_D$ under the AC stress can be carried out by using the following formulas (24) and (25) similar to the formulas (15) and (16) used for the N-MOS transistor:

$$F_{PAC}(t)=\int\{\delta F_P(t)/\delta t\}dt \quad (24)$$

$$\Delta I_D/I_D=(\Delta I_D/I_D)_f F_{PAC}(t) \quad (25)$$

where $F_{PAC}(t)$ represents a stress quantity after application of the AC stress for the time of t.

In the case of cyclic AC stress, the following formulas (26) and (27) similar to the formulas (17) and (18) can be used.

$$F_{Pr}(t) = \int_0^T r^n \left\{ \frac{\delta F_P(t)}{\delta t} \right\} dt \quad (26)$$

$$\frac{\Delta I_D}{I_D} = \left( \frac{\Delta I_D}{I_D} \right)_f \cdot F_{Pr}(t) \quad (27)$$

where $F_{pr}(t)$ represents a stress quantity after application of the AC stress having a cycle T for the time of t and then r represents a number of cycles.

Figure 18:
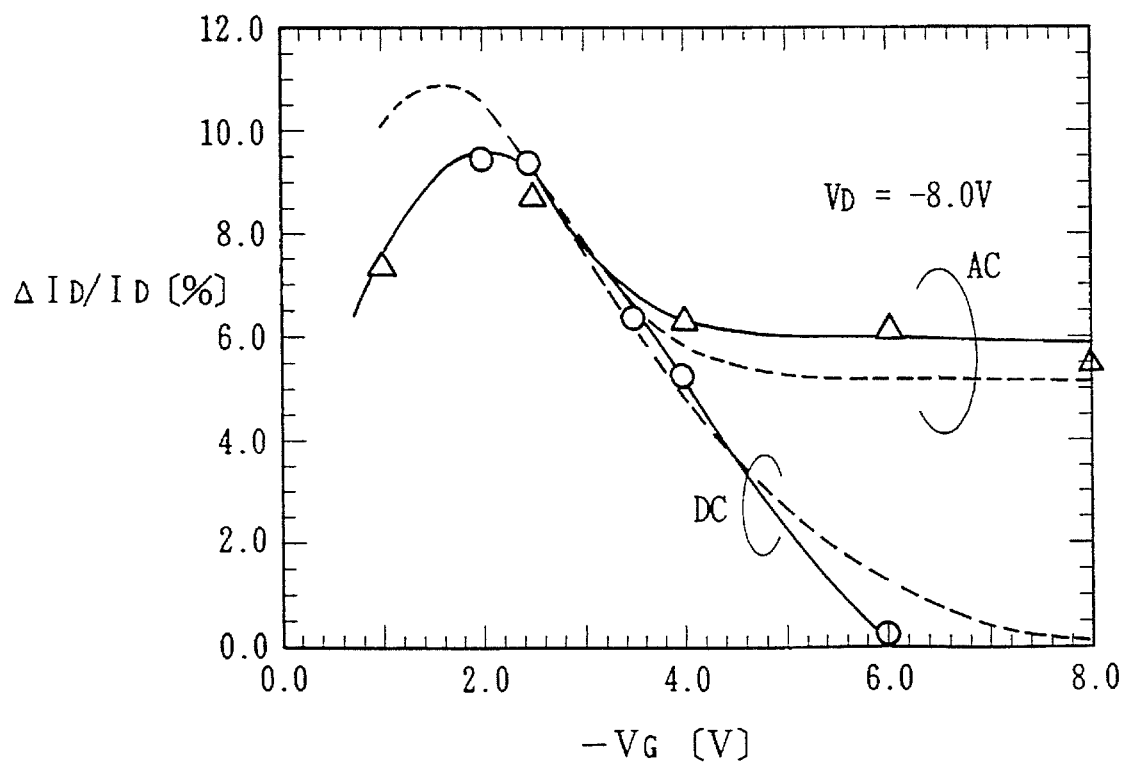
FIG. 18 is a graph showing a hot carrier deterioration rate $\Delta I_D/I_D$ after application of a DC or AC stress for 1000 seconds in the P-MOS transistor.

Referring to FIG. 18, there is shown the hot carrier deterioration rate $\Delta I_D/I_D$ obtained after elapsing of 1000 seconds under various stress conditions. In this graph, the abscissa represents the gate voltage $-V_G$ [V] and the ordinate represents the hot carrier deterioration rate $\Delta I_D/I_D$ [%]. Curved line connecting circle marks shows the experimental data under the DC stress, and curved broken line shows the simulation result. Curved solid line connecting triangle marks shows the experimental data under the AC stress, and curved broken line shows the simulation result. Under the AC stress, the gate voltage $V_G$ cyclically varies between 0 V and the voltage value indicated on the abscissa, similarly to the case in FIG. 12. In both the cases of DC and AC stresses, the drain voltage of −8.0 V is applied. According to the invention, as can be seen from the above, the hot carrier deterioration rate $\Delta I_D/I_D$ can be precisely simulated under various stress conditions even in the P-MOS transistor.

According to the invention, as described above, the index n in the formula used for simulation is not a constant, but is given by the experimental formula $n=g(V_G, V_D)$ depending on the stress condition. Therefore, the simulation can be executed more precisely than the prior art, and the hot carrier deterioration not only by the DC stress but also by the AC stress can be precisely simulated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of analyzing an integrated circuit of a semiconductor device comprising a plurality of components including an N-MOS transistor, which method comprises:

operating said semiconductor device;

predicting deterioration of the N-MOS transistor by simulating hot carrier deterioration; and taking corrective action in response to simulating hot carrier deterioration by isolating areas of the integrated circuit susceptible to hot carrier degradation effects;

wherein said simulating hot carrier deterioration of an N-MOS transistor comprises formulas (6) and (7):

$$F_N(t)=(W\cdot B)^{-n}\cdot I_{SUB}^{mn}\cdot I_D^{(1-m)n}\cdot t^n \quad (6)$$

$$\Delta I_D/I_D=(\Delta I_D/I_D)_f F_N(t) \quad (7)$$

where $F_N(t)$ represents a quantity of a hot carrier stress applied until a time t, W represents a width of a gate of said transistor, B represents a coefficient depending on a manufacturing condition of said transistor, $I_{SUB}$ represents a substrate current, $I_D$ represents a drain current, m represents an index which is deemed to be correlated to impact ionization and generation of interface energy levels, and $(\Delta I_D/I_D)$ represents a rate of a variation $\Delta I_D$ of said drain current at the time of expiration of a lifetime of said transistor to an initial value of said drain current $I_D$, wherein n is not a constant but is expressed as a function $n=g(V_G, V_D)$ of a gate voltage $V_G$ and a drain voltage $V_D$ which are applied at the time of said hot carrier stress, and said function is determined by a preliminary experiment.

2. The method according to claim 1, wherein said function $n=g(V_G, V_D)$ is expressed by:

$$g(V_G, V_D)=a+b\cdot(V_G-V_D)^i+c\cdot(V_G-V_D)^j \quad (11)$$

where a, b, c, i and j are real numbers.

3. The method according to claim 1, wherein said function $n=g(V_G, V_D)$ is expressed by:

$$g(V_G, V_D)=a+b\cdot(V_G/V_D)^i+c\cdot(V_G/V_D)^j \quad (13)$$

where a, b, c, i and j are real numbers.

4. The method according to claim 2, wherein said i is 1 and said j is 2.

5. The method according to claim 3, wherein said i is 1 and said j is 2.

6. The method according to claim 1, wherein the following formulas (15) and (16) are utilized in the case where the hot carrier stress condition changes depending on the time:

$$F_{NAC}(t)=\int\{\delta F_N(t)/\delta t\}dt \quad (15)$$

$$\Delta I_D/I_D=(\Delta I_D/I_D)_f F_{NAC}(t) \quad (16)$$

7. The method according to claim 1, wherein the following formulas (17) and (18) are utilized in the case where the hot carrier stress condition changes depending on the time:

$$F_{Nr}(t) = \int_0^T r^n \left\{ \frac{\delta F_N(t)}{\delta t} \right\} dt \quad (17)$$

$$\frac{\Delta I_D}{I_D} = \left( \frac{\Delta I_D}{I_D} \right)_f \cdot F_{Nr}(t) \quad (18)$$

where T represents one cycle time, and r represents frequency.

8. A method of analyzing an integrated circuit of a semiconductor device comprising a plurality of components including an P-MOS transistor, which method comprises:

operating said semiconductor device;

predicting deterioration of the P-MOS transistor by simulating hot carrier deterioration; and taking corrective action in response to simulating hot carrier deterioration by isolating areas of the integrated circuit susceptible to hot carrier degradation effects;

wherein said simulating hot carrier deterioration of a P-MOS transistor comprises formulas (20) and (21):

$$F_p(t) = B^{-n} \cdot W^{-mn} \cdot I_G^{mn} \cdot t^n \quad (20)$$

$$\Delta I_D/I_D = (\Delta I_D/I_D)_f F_p(t) \quad (21)$$

where $F_p(t)$ represents a quantity of a hot carrier stress applied until a time t, B represents a coefficient depending on a manufacturing condition of said transistor, W represents a width of a gate of said transistor, $I_G$ represents a gate current, m represents an index which is deemed to be correlated to impact ionization and generation of interface energy levels, and $(\Delta I_D/I_D)$ represents a rate of a variation $\Delta I_D$ of said drain current at the time of expiration of a lifetime of said transistor to an initial value of said drain current $I_D$, wherein n is not a constant but is expressed as a function $n=g(V_G, V_D)$ of a gate voltage $V_G$ and a drain voltage $V_D$ which are applied at said time of said hot carrier stress, and said function is determined by a preliminary experiment.

9. The method according to claim 8, wherein said function $n=g(V_G, V_D)$ is expressed by:

$$g(V_G, V_D) = a + b \cdot (V_G - V_D)^i + c \cdot (V_G - V_D)^j \quad (11)$$

where a, b, c, i and j are real numbers.

10. The method according to claim 8, wherein said function $n=g(V_G, V_D)$ is expressed by:

$$g(V_G, V_D) = a + b \cdot (V_G/V_D)^i + c \cdot (V_G/V_D)^j \quad (13)$$

where a, b, c, i and j are real numbers.

11. The method according to claim 9, wherein said i is 1 and said j is 2.

12. The method according to claim 10, wherein said i is 1 and said j is 2.

13. The method according to claim 8, wherein the following formulas (24) and (25) are utilized in the case where the hot carrier stress condition changes depending on the time:

$$F_{PAC}(t) = \int \{\delta F_p(t)/\delta t\} dt \quad (24)$$

$$\Delta I_D/I_D = (\Delta I_D/I_D)_f F_{PAC}(t)$$

14. The method according to claim 8, wherein the following formulas (26) and (27) are utilized in the case where the hot carrier stress condition changes depending on the time:

$$F_{Pr}(t) = \int_0^T r^n \left\{ \frac{\delta F_P(t)}{\delta t} \right\} dt \quad (26)$$

$$\frac{\Delta I_D}{I_D} = \left( \frac{\Delta I_D}{I_D} \right)_f \cdot F_{Pr}(t) \quad (27)$$

where T represents one cycle time, and r represents frequency.

* * * * *